United States Patent [19]

Blair et al.

[11] Patent Number: 4,611,389
[45] Date of Patent: Sep. 16, 1986

[54] LOW-COST POWER DEVICE PACKAGE WITH QUICK-CONNECT TERMINALS AND ELECTRICALLY ISOLATED MOUNTING MEANS

[75] Inventors: Kelvin R. Blair; Lynn C. Furman, both of Tempe; David M. Knott, Scottsdale, all of Ariz.

[73] Assignee: Motorola, Inc., Schaumburg, Ill.

[21] Appl. No.: 712,833

[22] Filed: Mar. 18, 1985

Related U.S. Application Data

[60] Division of Ser. No. 549,211, Nov. 3, 1983, Pat. No. 4,530,003, which is a continuation of Ser. No. 230,466, Feb. 2, 1982, abandoned.

[51] Int. Cl.$^4$ ............ H01L 23/34; H01L 23/48; H01L 23/28
[52] U.S. Cl. .................................... 29/589; 29/591; 148/1.5; 357/72; 357/80; 357/81
[58] Field of Search ............. 29/571, 589, 590, 591; 148/1.5; 357/72, 80, 81

[56] References Cited

U.S. PATENT DOCUMENTS

| | | | |
|---|---|---|---|
| 3,290,564 | 12/1966 | Romano | 357/72 |
| 3,729,573 | 2/1973 | Coldren | 357/70 |
| 3,783,347 | 2/1974 | Fichot et al. | 357/81 |
| 4,117,508 | 2/1979 | De Ross | 357/81 |
| 4,158,745 | 2/1979 | Keller | 357/70 |
| 4,199,654 | 1/1981 | Koenig | 357/81 |
| 4,249,034 | 1/1981 | Vladik | 357/72 |
| 4,252,864 | 1/1981 | Dunn | 357/72 |
| 4,259,685 | 1/1981 | Wolff | 357/81 |

Primary Examiner—Brian E. Hearn
Assistant Examiner—David A. Hey
Attorney, Agent, or Firm—Robert M. Handy

[57] ABSTRACT

A semiconductor device package structure having a conventional base outline, a heat spreader, and top-mounted, quick-connect terminals for external connection is described. A pre-packaged semiconductor device is attached to a lead frame containing terminals in a predetermined configuration, and then overmolded with a plastic encapsulant so that the heat spreader of the prepackaged device protrudes a predetermined distance from the mounting surface of the package to make possible good thermal contact with a heat sink. Insulated means to facilitate mounting are built-in.

11 Claims, 7 Drawing Figures

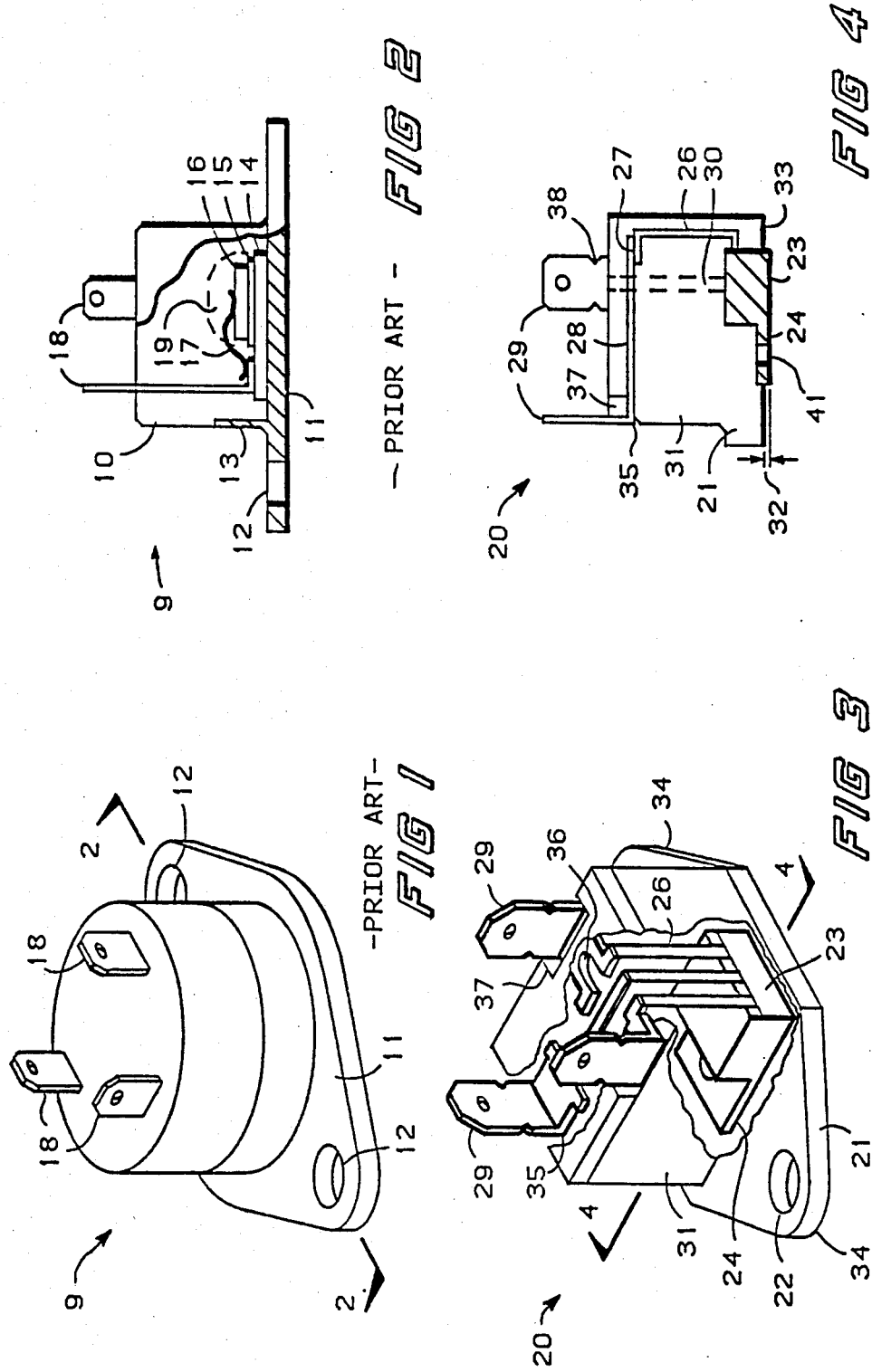

LOW-COST POWER DEVICE PACKAGE WITH QUICK-CONNECT TERMINALS AND ELECTRICALLY ISOLATED MOUNTING MEANS

This is a division of application Ser. No. 549,211 filed Nov. 3, 1983, now U.S. Pat. No. 4,530,003 which is a continuation of application Ser. No. 230,466 filed on Feb. 2, 1982, now abandoned.

BACKGROUND OF THE INVENTION

This invention relates to improved semiconductor device packages and, more particularly, to a low-cost semiconductor device package structure having quick-connect terminals, an integral heat spreader, an insulating plastic body, and the ability to utilize existing prepackaged semiconductor devices of known characteristics to achieve overall low cost, ease of use, and high reliability.

Quick-connect terminals are a convenient means for making electrical connection to a variety of electrical components where substantial power handling capability is required. Many electrical components are available with these types of terminals and are widely used in industry. However, it is only recently that semiconductor devices have been built with quick-connect terminals because of the difficulties encountered in attaching the relatively heavy terminals to the fragile semiconductor chip in such a way that the forces exerted on the terminals during normal use are absorbed by the device package and not transmitted to the semiconductor chip or fragile interconnections.

As used herein, quick-connect terminals refer to those electrical terminals which can be readily contacted by mechanical means, preferably by plugs, wire wrapping, or spring clips, as opposed to welding, soldering or other metallurgical bonds.

Several semiconductor power device packages with quick-connect terminals have been recently introduced. However, these prior art designs have shown poor power cycling reliability. They use many separate parts, are poorly suited for mechanized assembly, and they are expensive to manufacture. Thus, a need continues to exist for a semiconductor device pckage having quick-connect terminals which is reliable, of low cost, readily adaptable to automated or semi-automated assembly, and easy to electrically isolate from the surfaces on which it is to be mounted.

A significant factor which delays the widespread commercial adoption of a new package configuration is the concern exhibited by many users about the reliability of semiconductor devices when encapsulated in a new and untried package. It is well known that there is significant interaction between the semicondcutor chip and the materials and methods used to encapsulate it and that frequently these interactions can have deleterious effects upon the reliability of the semiconductor device. Ordinarily, substantial amounts of life test data and field experience are demanded by prospective users before a new chip-package combination can achieve widespread acceptance. Each time the geometric forms and material selections are changed, particularly for those items in direct contact with the semiconductor chip (e.g. die coating materials placed over the chip, heat spreader geometry, lead bond positions and attachment techniques, etc.), a cycle of slow customer acceptance is repeated. Thus, a quick-connect terminal package configuration which can utilize prepackaged devices of known behavior and reliability, and with a long manufacturing history, has substantial advantages in achieving rapid customer acceptance since the crucial relationships between the semiconductor chip and its immediate package environment can be preserved. The manufacturing history and reliability of the prepackaged device is directly transferrable to the new package configuration and more rapid customer acceptance can be expected. There is a considerable cost saving to both manufacturer and user as a consequence of the reliability testing and product qualification programs that can be reduced or simplified.

Accordingly, an object of the present invention is to provide a quick-connect package configuration of lower cost.

An additional object of this invention is to provide a quick-connect package configuration of improved reliability.

A further object of this invention is to provide a quick-connect package configuration making use of fully tested prepackaged devices of established manufacturing history, low manufacturing costs and known reliability.

A further object of this invention is to provide a quick-connect package configuration which does not require use of an internal isolator to conveniently make possible electrical isolation of the semiconductor device from the mount to which the package is attached, and which can be easily insulated from a mounting surface without elaborate bushings or sleeves.

An additional object of this invention is to reduce the number of piece parts which must be assembled.

A further object of this invention is to provide a configuration suitable for automated assembly in order to further reduce the cost.

An additional object of this invention is to provide an insulated body and attachment means which is electrically insulated from the semiconductor device, its leads, and its heat spreader.

It is a further object of this invention to provide a quick-connect package configuration which can conform to industry standard terminal and base outline geometries.

SUMMARY OF THE INVENTION

The attainment of the foregoing and other objectives and advantages, is achieved through the present invention wherein a prepackaged semiconductor device having an exposed heat spreader and leads is attached to a lead frame having quick-connect terminals which is then formed, typically by bending, to locate the heat spreader and the quick-connect terminals in predetermined positions. This formed assembly is surrounded by a molding compound, typically an injection molded insulating plastic, so that the heat spreader is partially exposed on one face of the molded assembly to permit it to be clamped securely against a mount such as a heat sink, and the quick-connect terminals protrude from another face where they can be readily contacted. The heat spreader must be parallel with and protrude a predetermined distance from the molded package and means are included to facilitate attachment of the completed package to a mount, these means being insulated from any conductive members of the prepackaged semiconductor device. Further, where the prepackaged device is not internally isolated and where it is required that the heat spreader be electrically isolated from the mount to which it is clamped, a thin insulating layer or external insulating spacer can be used. The mold compound used for encapsulation of the formed assembly must satisfy certain criteria with respect to strength, plastic flow, thermal stability, coefficient of expansion and compatibility with the semiconductor device.

BRIEF DESCRIPTION OF THE DRAWINGS

A more complete understanding of the present invention can be obtained by considering the following detailed description in conjunction with the accompanying drawings, in which FIG. 1 illustrates a prior art semiconductor device package having quick-connect terminals;

FIG. 2 illustrates a partial cross-section of the device of FIG. 1;

FIG. 3 illustrates a semiconductor device package having quick-connect terminals of the present invention;

FIG. 4 illustrates in schematic form a cross-section of the device package of FIG. 3;

DETAILED DESCRIPTION OF THE PREFERRED EMBODIMENT

Figure 5:
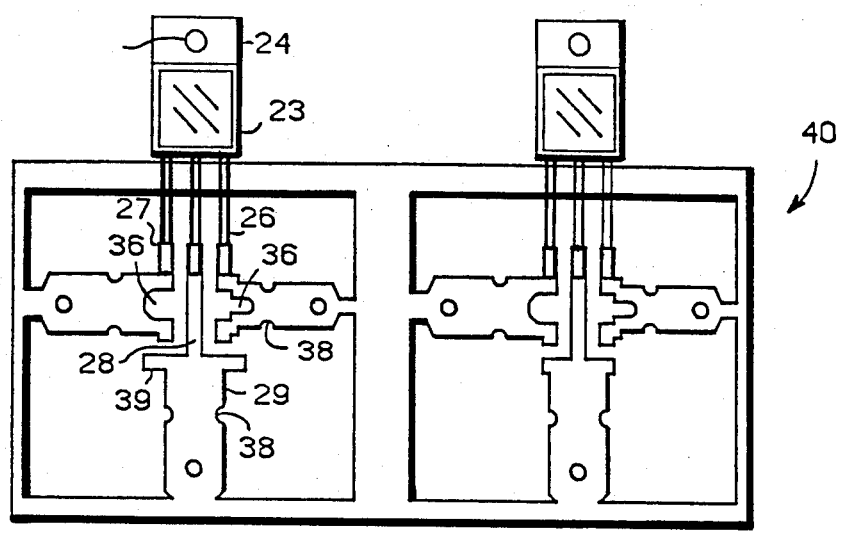
FIG. 5 illustrates an example of the attachment of a prepackaged semiconductor device to a lead frame portion containing quick-connect terminals.

FIG. 1 illustrates a prior art example of semiconductor power device package 9 having quick-connect terminals 18 with mounting base 11 and mounting holes 12 corresponding to an industry standard TO-3 package base configuration. Base 11 is metallic.

FIG. 2 is a partial cross-section of the prior art device of FIG. 1 showing the internal construction. Typically, metallized insulating ceramic 14, usually aluminum oxide or beryllium oxide, is used to electrically isolte heat spreader 15 and semiconductor die 16 from base 11. To avoid direct transmission of mechanical forces from quick-connect terminals 18 to semiconductor die 16, the quick-connect terminals are first attached to ceramic isolator 14 and then connected to semiconductor device 16 by interconnect strap 17. Semiconductor die or chip 16 is typically covered with protective die coat 19. Plastic compound 10 is molded or potted around the entire assembly to provide protection and mechanical strength. Ring 13 of base 11 aids in retaining the molding compound.

Significant disadvantages of the prior art design illustrated in FIGS. 1 and 2 are the large number of individual piece parts required, the use of a costly metallized ceramic isolator, and the large number of metallurgical joints required. For example, six solder joints are required in the illustrated design. When the semiconductor device is, for example, subjected to power surges, there is rapid heating and cooling of the semiconductor chip which, due to the differential thermal expansion of the metal, ceramic, and semiconductor parts, creates significant mechanical stress which can lead, after a number of cycles, to device failure. It is well known that devices employing a large number of solder joints are less reliable than those employing fewer joints. Further, soldering is generally less reliable than welding or brazing.

With semiconductor power devices, good thermal coupling must be provided between the semiconductor die and the mounting surface acting as a heat sink. For optimal thermal conduction, the semiconductor die should be located directly on the metal base or with at most an intermediate high conductivity heat spreader. With this arrangement, the semiconductor die is electrically connected to the metallic base and, in turn, to any metallic mounting surface on which the base may be installed. There are many applications in which it is desirable to electrically isolate the semiconductor die from the metallic mounting surface (heat sink). This can be accomplished either internally through the use of a ceramic isolator as illustrated in FIG. 2, externally by placing an insulating spacer beneath the base and utilizing insulated bushings surrounding the mounting screws which pass through holes 12. Both methods are expensive because of the additional piece parts and assembly or installation labor required.

Figure 7:
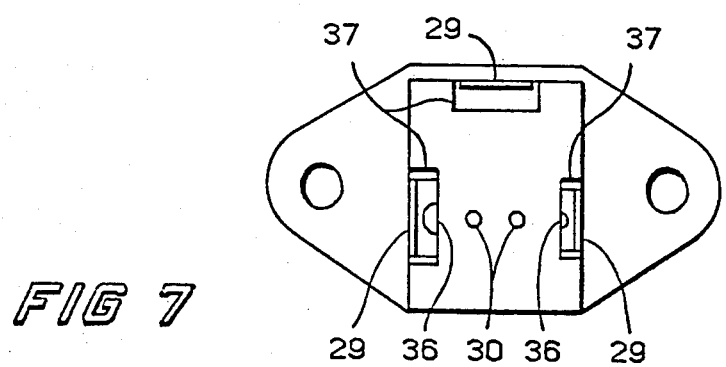
FIG. 7 shows a top view of the device package of FIG. 3.

FIGS. 3, 4, and 7 illustrate a preferred embodiment of the present invention. Improved semiconductor device package 20 is composed of prepackaged semiconductor device 23 having heat spreader 24 and leads 26 which are connected at joint 27, preferably by welding, to heavier leads 28 which terminate in quick-connect terminals 29. Base 21 and body 31 are composed of an insulating moldable compound, preferably a plastic encapsulant, although other insulating materials can be used. One or more holes 30 are formed in body 31 by one or more pressure fingers (not illustrated) placed against prepackaged device 23 during manufacture so that device 23 is held tightly in a mold. In FIG. 4, leads 26 are shown to be joined at 27 to leads 28 using bends in the form of a left facing "C". A left facing "Z" bend or other configuration can also be used. It is important that leads internal to body 31 (for example, leads 26 and 28) have such form, strength, and encapsulant adhesion that mechanical forces applied to terminals 29 are absorbed by body 31 and not transmitted to any fragile interconnections or to the semiconductor chip.

A preferred method of construction in accordance with the present invention, and which is readily automated, is illustrated in FIG. 5. Prepackaged semiconductor device 23 (in this case a TO-220 type package) having heat spreader 24 and leads 26 is attached by welding leads 26 to lead frame 40 at connection points 27 of formable leads 28 and quick-connect terminal 29 to provide as assembly. Welding is the preferred method of attachment but other methods may be used. Lead frame 40 is prepared by methods well known per se in the art and may be of any convenient conductive metal such as brass, copper, aluminum, plated steel, or a combination thereof which is readily formed and readily attached to the leads of prepackaged device 23. Since a prepackaged part may be fully tested prior to assembly, and since in the preferred embodiment only the prepackaged part and the lead frame need be handled, automated assembly with high manufacturing yield can be readily obtained. Even counting the lead frame and die used to make the prepackaged TO-220, significantly fewer piece parts are required for the device of FIG. 3 compared to the prior art device illustrated in FIG. 2. While the use of pretested devices is particularly convenient it is not essential.

Following attachment of device 23 to lead frame 40, the leads and terminals are formed into the configuration illustrated in FIGS. 3–4 and the assembly inserted in a mold cavity. As used herein, "formed" or "forming" is intended to encompass one or more mechanical shaping steps which may be conveniently performed before, during, or after encapsulation.

A small depression is provided in the base of the mold cavity wherein prepackaged device 23 is placed so that prepackaged device 23 will protrude a predetermined amount 32 below mounting face 33 of semiconductor package 20. This depression in the mold cavity may be optionally provided with a pin engaging hole 41 of heat spreader 24 to provide further alignment and positioning of prepackaged device 23. Heat spreader 24 of prepackaged device 23 is arranged to be parallel with mounting face 33 of semiconductor package 20. During the molding process pressure is applied to prepackaged semiconductor device 23 through holes 30 to maintain it in intimate contact with the surface of the mold cavity so as to prevent molding compound from penetrating between prepackaged device 23 and the surface of the mold cavity against which it rests. This is to insure that intimate contact can be obtained when desired between heat spreader 24, and a mounting surface (e.g. a heat sink) to which it is installed by the user. Because mounting base 21 and body 31 are of an insulating material, preferably a plastic, it is not necessary to provide insulated bushings surrounding the mounting screws when installing the semiconductor package on a metallic mounting surface.

If it is desired to electrically isolate heat spreader 24 from a metallic mounting surface, an electrically insulating external spacer or tape of good thermal conductivity can be utilized. Mica is a common example and other materials are well known per se in the art. No special alignment or precision fixturing is required. This method of isolating the device is less expensive than an internal ceramic isolator, or a combination of insulated spacer and insulated mounting screws in connection with metal base devices of the prior art. Nevertheless, the prepackaged device of the present invention may include an internal electrical isolator and the term "heat spreader" as used herein is intended to comprise any metallic, non-metallic, or composite structure used to provide substantial thermal coupling between the semiconductor die or chip and the exterior of the prepackaged device.

Figure 6:
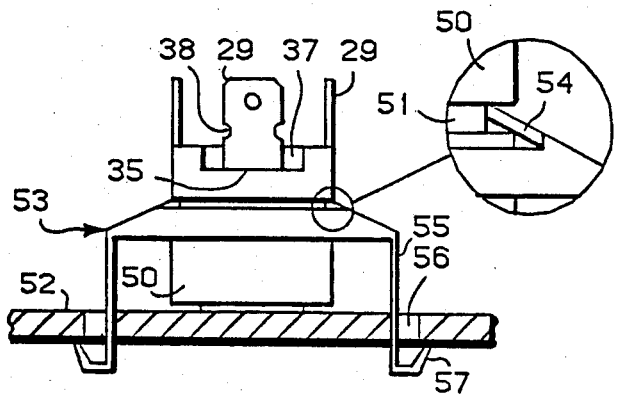
FIG. 6 shows an alternative embodiment of the invented semiconductor device package with alternative means for installing said package on a mounting surface.

FIG. 6 illustrates an alternative configuration providing a simplified method of installing the semiconductor device on a mounting surface. Semiconductor device 50 which may be of any convenient shape and containing one or more circumferential indentations 51 is pressed against mounting surface 52 by means of spring clip 53 having one or more tabs 54 engaging indentations 51 and one or more legs 55 passing through mounting holes 56 and retained by bent portions 57. In operation, semiconductor device 50 is placed against mounting surface 52 and spring clip 53 pressed over the device to engage indentations 51 and maintain pressure between device 50 and mounting surface 52 by means of spring members 54, 55 and 57. Indentations 51 need not be continuous as long as they provide purchase for tabs 54 at two or more points on the perimeter of the body of device 50. The use of such a structure eliminates the need for mounting screws and reduces the installation labor of the user.

The material used to encapsulate the formed assembly must be an insulator, and must be capable of withstanding the mechanical forces associated with installation on a mount and connection to the terminals. It must not exhibit any significant cold flow, and must be compatible in adhesion, coefficient of expansion, thermal stability, and other mechanical, chemical and electrical properties with the materials of the prepackaged device. For example, with a two mounting hole package, such as illustrated in FIGS. 3-4, mounting flanges 34, i.e. those portions of base 21 lying outside of body 31, are clamped against the mounting surface by screws, rivets, or spring clips passing through holes 22. The encapsulation material which forms base 21 must have sufficient strength to permit flanges 34 to be clamped without breaking, despite the bending moment which occurs as a reult of the protrusion of the heat spreader.

Control of the amount (32 of FIG. 4) by which heat spreader 24 protrudes from mounting face 33 of package base 21 is thus important and depends upon the encapsulation material chosen. If amount 32 of FIG. 4 is less than zero, then heat spreader 24 does not protrude and there will be inadequate thermal contact with a planar mounting surface. Conversely, if protrusion amount 32 is too great then excessive mechanical stress on the package will result during installation on the mounting surface and package failure may occur. For the encapsulation materials used, protrusion by 0-2 mils (0.0-0.05 mm) is preferred but 0-10 mils (0-0.25 mm) is satisfactory. The stronger the plastic, the larger the allowable protrusion.

Glass filled phenolic plastics and epoxy plastics have been found to give satisfactory results, although other materials meeting the general criteria may be used. In the TO-3 type configuration, glass filled phenolic has been found to have a breaking strength (17 in-lbs; 1.9 Nm) comparable to the bending strength of steel (17 in-lbs; 1.9 Nm) and greater than the bending strength of aluminum (15 in-lbs; 1.7 Nm) measured at the mounting holes (22 of FIG. 3) of available TO-3 type packages. Both epoxy and glass filled phenolics were found to be compatible with silicone encapsulated TO-220 prepackaged devices. While the use of prepackaged devices that are already encapsulated is particularly convenient, unencapsulated devices may also be used, provided that the materials used to encapsulate the formed assembly are also compatible with the semiconductor chip and any die coating used thereon. Thus as used herein, the term prepackaged devices is intended to include semiconductor devices with or without leads, die coat, or encapsulant.

An additional feature of the invention (FIGS. 3-7) is stress relief cutouts 36 in terminals 29 adjacent or at the point of exit from body 31 to permit terminals 29 to flex perpendicularly to their broad faces without damaging the encapsulation or transmitting force to the enclosed semiconductor. Enlarged portion 39 of lead 28 of quick-connect terminal 29 adjacent to the point of exit from body 31 also contributes to stress relief by increasing the bending strength and adhesion of the embedded portion relative to the exposed portion. Notch 37 is provided in package bodies 31 and 50 to permit flexure of terminals 29 and to permit insertion after encapsulation of a forming tool to bend terminals 29 at bending point 35 into their final position. Notches 38 are provided in terminals 29 to facilitate user connection to terminals 29 by wire-wrapping. Terminals 29 are arranged so as to mate with a single plug connector only in one orientation to preclude accidental misconnection. Other terminal shapes and arrangements suitable for quick-connect attachment will be apparent to those skilled in the art.

Although the present invention has been illustrated utilizing a TO-220 configuration for the prepackaged device, it will be apparent to those skilled in the art that other package configurations, as for example a TO-218 or "half TO-3", are possible for the prepackaged semiconductor device as long as it has an exposed heat spreader or face, and leads capable of being connected to quick-connect terminals. Similarly, although the completed device has been illustrated in the form of a TO-3 base and mounting configuration, other standard or new alternative mounting configurations can be readily achieved.

Thus it is apparent that there has been provided in accordance with this invention an improved semiconductor device package of lower cost and improved reliability, which is able to make use of prepackaged devices which are fully tested and of known reliability, which does not require expensive internal isolators, which reduces the number of piece parts to be handled, which has a configuration suited for automated assembly, which may be readily isolated by an external isolator without the use of insulated bushings, and in which the mounting means is electrically isolated from the semiconductor device.

Having thus decribed the invention, it will be apparent to those of skill in the art that various modifications can be made within the spirit and scope of the present invention. Accordingly, it is intended to encompass all such modifications.

We claim:

1. A process for the fabrication of a semiconductor device package with integral heat spreader, quick-connect terminals, insulated body, and utilizing prepackaged devices, comprising the steps of:
   connecting electrical leads of a prepackaged device having an exposed heat spreader to a lead frame having quick-connect terminals to provide an assembly;
   forming said assembly into a predetermined shape;
   positioning said assembly in a mold cavity such that said heat spreader rests in a depression of predetermined depth in a first surface of said mold cavity and is substantially coplanar with said first surface, and such that a plastic encapsulant is substantially prevented from penetrating between said heat spreader and said mold cavity;
   introducing said plastic encapsulant into said mold cavity around said assembly to provide an insulating body and insulating attachment means to facilitate attachment of said body to a mounting surface.

2. The process of claim 1 wherein said plastic encapsulant comprises a material selected from the group consisting of glass filled phenolic plastics and epoxy plastics.

3. The process of claim 1 wherein said forming step comprises at least two operations, a first operation carried out before said introducing step for bending at least said leads of said prepackaged device, and a second operation carried out after said introducing step for bending at least said quick-connect terminals.

4. The process of claim 1 wherein said forming step comprises the step of bending at least said leads of said prepackaged devices in a direction away from the plane of said exposed heat spreader.

5. The process of claim 4 wherein said bending step comprises bending said leads at substantially right angles to the plane of said exposed heat spreader.

6. The process of claim 4 wherein said forming step further comprises bending either or both of a portion of said lead frame or said leads of said prepackaged device so that said quick-connect terminals lie in a plane substantially parallel to said exposed heat spreader.

7. The process of claim 6 wherein said bending step comprises a first bend substantially at ninety degress to said exposed heat spreader and a second bend substantially at ninety degrees to said first bend.

8. The process of claim 6 comprising a further bending step performed after said introducing step for orienting said quick-connect terminals in a direction away from the plane of said exposed heat spreader.

9. A process for making a semiconductor containing unit comprising:
   providing a prepackaged device containing a semiconductor die and having external leads and an exposed heat spreader with an outward facing principal face;
   providing a lead frame having a plurality of quick-connect terminal therein;
   attaching said external leads of said prepackaged device to said lead frame to form an assembly, wherein said quick-connect terminals are coupled to said external leads;
   bending a first portion of said assembly in a direction away from said principal face of said exposed heat spreader;
   bending a second portion of said assembly in a direction parallel with said principal face of said exposed heat spreader;
   placing said assembly in a mold cavity;
   introducing a plastic encapsulant into said mold cavity around some of said assembly so that said quick-connect terminals and said heat spreader are at least partly exposed; and
   bending at least one of said quick-connect terminals in a direction away from said principal face.

10. The process of claim 9 wherein said placing step comprises positioning said assembly in said mold cavity such that said principal face of said heat spreader rests in a depression in a first surface of said mold cavity.

11. The process of claim 10 wherein said placing step further comprises positioning said assembly in said mold cavity such that said lead frame is substantially parallel with said first surface.

* * * * *